United States Patent
Takamine

(10) Patent No.: US 7,880,561 B2
(45) Date of Patent: Feb. 1, 2011

(54) SURFACE ACOUSTIC WAVE FILTER DEVICE AND DUPLEXER

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 59 days.

(21) Appl. No.: 12/414,696

(22) Filed: Mar. 31, 2009

(65) Prior Publication Data

US 2009/0179715 A1 Jul. 16, 2009

Related U.S. Application Data

(63) Continuation of application No. PCT/JP2007/068773, filed on Sep. 27, 2007.

(30) Foreign Application Priority Data

Oct. 31, 2006 (JP) ............................. 2006-295672

(51) Int. Cl.
*H03H 9/64* (2006.01)
*H03H 9/72* (2006.01)
(52) U.S. Cl. ....................... 333/133; 333/195
(58) Field of Classification Search ................ 333/193, 333/195, 133; 310/313 B, 313 D
See application file for complete search history.

(56) References Cited

U.S. PATENT DOCUMENTS

| 5,721,519 A | 2/1998 | Onishi et al. | |
| 6,081,172 A * | 6/2000 | Strauss et al. | 333/193 |
| 6,919,781 B2 * | 7/2005 | Baier et al. | 333/195 |
| 7,034,639 B2 * | 4/2006 | Takamine et al. | 333/195 |
| 7,378,923 B2 * | 5/2008 | Takamine | 333/193 |
| 2001/0013815 A1 | 8/2001 | Sawada | |
| 2003/0107457 A1 * | 6/2003 | Kawase et al. | 333/193 |
| 2004/0201435 A1 * | 10/2004 | Ouchi et al. | 333/195 |
| 2007/0182511 A1 | 8/2007 | Takamine | |

FOREIGN PATENT DOCUMENTS

| JP | 04-054011 A | 2/1992 |
| JP | 08-065098 A | 3/1996 |
| JP | 2002-314370 A | 10/2002 |
| JP | 2006-254410 | * 9/2006 |
| WO | WO 98/34345 | * 8/1998 |
| WO | WO 98/57428 | * 12/1998 |

OTHER PUBLICATIONS

Official Communication issued in International Patent Application No. PCT/JP2007/068773, mailed on Dec. 18, 2007.

* cited by examiner

*Primary Examiner*—Barbara Summons
(74) *Attorney, Agent, or Firm*—Keating & Bennett, LLP

(57) ABSTRACT

A surface acoustic wave (SAW) filter device includes first and second longitudinally coupled SAW filter units. The first and second filter units are cascade-connected to each other. A phase of a signal flowing through a first signal line electrically connecting second IDTs of the first and second SAW filter units is different by about 180° from a phase of a signal flowing through a signal line electrically connecting third IDTs of the first and second SAW filter units. A SAW resonator is connected between the first and second signal lines. A resonance point of the SAW resonator is set in an attenuation region in the vicinity of the edge of a low frequency side of a filter passband or an anti-resonance point of the SAW resonator is set in an attenuation region in the vicinity of the edge of a high frequency side of the filter passband.

5 Claims, 11 Drawing Sheets

SURFACE ACOUSTIC WAVE FILTER DEVICE AND DUPLEXER

BACKGROUND OF THE INVENTION

1. Field of the Invention

The present invention relates to a surface acoustic wave filter device having a cascade-connected structure including a plurality of longitudinally coupled resonator type surface acoustic wave filter units and a duplexer including the surface acoustic wave filter device and, in particular, to a surface acoustic wave filter device having a surface acoustic wave resonator electrically connected between stages thereof and a duplexer including the surface acoustic wave filter device.

2. Background of the Related Art

A surface acoustic wave filter device is commonly used as a bandpass filter in an RF stage of a cellular phone. There is a high demand for this type of surface acoustic wave filter device to support a high-frequency operation, and for a balanced-unbalanced transform function to be incorporated in the surface acoustic wave filter device.

Recently, a frequency bandwidth used in cellular phones has increased, and a frequency band on a transmission side and a frequency band on a reception side are closer to each other. A bandpass filter must have a wide passband and high frequency selectivity, and more specifically, the bandpass filter must have sharp filter characteristics.

To increase the sharpness of the filter characteristics, a technique of connecting surface acoustic wave resonators, in series or in parallel, with longitudinally coupled resonator type surface acoustic wave filters is commonly used in the conventional art.

In the configuration in which a surface acoustic wave resonator is connected in series with a longitudinally coupled resonator type surface acoustic wave filter, sharpness at the high frequency side of the passband is increased by setting a resonance point of the surface acoustic wave resonator in a passband of the filter and by setting an anti-resonance point of the surface acoustic wave resonator in an attenuation region in the vicinity of a high frequency end of the filter passband.

In contrast, in a configuration in which a surface acoustic wave resonator is in parallel with a longitudinally coupled resonator type surface acoustic wave filter, sharpness at the low frequency side of the passband is increased by setting an anti-resonance point of the surface acoustic wave resonator within the filter passband and by setting a resonance point of the surface acoustic wave resonator in an attenuation region in the vicinity of a low frequency edge of the filter passband.

Whether the surface acoustic wave resonator is to be connected to an input terminal or an output terminal of the longitudinally coupled resonator type surface acoustic wave filter may be determined based on the impedances of the input terminal and the output terminal.

On the other hand, in a configuration in which two stages of longitudinally coupled resonator type surface acoustic wave filters are cascade-connected, a surface acoustic wave resonator may be connected between the two surface acoustic wave filters, i.e., between the stages. Japanese Unexamined Patent Application Publication (Translation of PCT Application) No. 4-54011 discloses a longitudinally coupled resonator type surface acoustic wave filter device having a two cascade-connected structure with a surface acoustic wave resonator connected between the stages.

FIG. 12 is a plan view schematically illustrating a surface acoustic wave filter device described in Japanese Unexamined Patent Application Publication (Translation of PCT Application) No. 4-54011.

A surface acoustic wave filter device 1001 includes an electrode structure arranged on a piezoelectric substrate 1002. The surface acoustic wave filter device 1001 includes an input terminal 1003 and an output terminal 1004. First and second surface acoustic wave filter units 1005 and 1006 are connected between the input terminal 1003 and the output terminal 1004.

The first and second surface acoustic wave filter units 1005 and 1006 respectively include first and second IDTs 1005$a$ and 1005$b$ and first and second IDTs 1006$a$ and 1006$b$ arranged to be adjacent to each other in a surface acoustic wave propagation direction. Reflectors 1005$c$ and 1005$d$ are arranged on both sides of an area in which the IDTs 1005$a$ and 1005$b$ are arranged in the surface acoustic wave propagation direction. Similarly, reflectors 1006$c$ and 1006$d$ are arranged on both sides of an area in which IDTs 1006$a$ and 1006$b$ are arranged in the surface acoustic wave propagation direction.

One end of the first IDT 1005$a$ of the first surface acoustic wave filter unit 1005 is connected to the input terminal 1003. On the other hand, one end of the second IDT 1006$b$ of the second surface acoustic wave filter unit 1006 is connected to the output terminal 1004. One end of the second IDT 1005$b$ is connected to one end of the first IDT 1006$a$ via a signal line 1007, and the first and second surface acoustic wave filter units 1005 and 1006 are thus electrically connected to each other. The other end of each of IDTs 1005$a$, 1005$b$, 1006$a$, and 1006$b$ is connected to the ground potential.

In the surface acoustic wave filter device 1001 in which the first and second surface acoustic wave filter units 1005 and 1006 are two-stage cascade-connected, a surface acoustic wave resonator 1008 is connected between the signal line 1007 and the ground potential. One end of the surface acoustic wave resonator 1008 is connected to the signal line 1007 and the other end of the surface acoustic wave resonator 1008 is connected to the ground potential. More specifically, the surface acoustic wave resonator 1008 between the stages is connected between the signal line and the ground potential.

The amount of attenuation is increased in the attenuation region of the high frequency side of the passband by setting the resonance point of the surface acoustic wave resonator 1008 in the attenuation region of the high frequency side of the passband. More specifically, the surface acoustic wave resonator 1008 is connected in the surface acoustic wave filter device 1001 described in Japanese Unexamined Patent Application Publication (Translation of PCT Application) No. 4-54011 not for the purpose of increasing the sharpness on the low frequency side of the passband but for the purpose of increasing the amount of attenuation in the attenuation region of the high frequency side of the passband.

In the surface acoustic wave filter device 1001 described in Japanese Unexamined Patent Application Publication (Translation of PCT Application) No. 4-54011, the surface acoustic wave resonator 1008 is connected in parallel, and more specifically in parallel with the IDTs 1005$b$ and 1006$b$ in an inter-stage portion, and one end of the surface acoustic wave resonator 1008 is connected to the ground potential. For this reason, a capacitance of the inter-stage portion increases with respect to the ground potential, which causes the passband to become narrow. Thus, the surface acoustic wave filter device cannot sufficiently satisfy wide band requirements.

SUMMARY OF THE INVENTION

To overcome the problems described above, preferred embodiments of the present invention provide a surface acoustic wave filter device having an increased sharpness of the filter characteristics and an expanded passband with a structure in which a plurality of longitudinally coupled resonator type surface acoustic wave filters that are cascade-connected with a surface acoustic wave resonator connected in an inter-stage portion thereof.

A surface acoustic wave filter device according to a first preferred embodiment of the present invention includes a piezoelectric substrate, first and second longitudinally coupled resonator type surface acoustic wave filter units that are cascade-connected and arranged on the piezoelectric substrate, and at least one surface acoustic wave resonator arranged on the piezoelectric substrate. Each of the first and second surface acoustic wave filter units includes a first IDT, and second and third IDTs arranged on both sides of the first IDT in a surface acoustic wave propagation direction, and first and second reflectors arranged in the surface acoustic wave propagation direction on both sides of an area in which the first through third IDTs are arranged, the surface acoustic wave propagation directions of the first and second surface acoustic wave filter units being parallel or substantially parallel with each other. Each of the first and second surface acoustic wave filter units further includes a first signal line electrically connecting the second IDT of the first surface acoustic wave filter unit to the second IDT of the second surface acoustic wave filter unit, and a second signal line electrically connecting the third IDT of the first surface acoustic wave filter unit to the third IDT of the second surface acoustic wave filter unit. An electrical signal flowing through the first signal line is different in phase by about 180° from an electrical signal flowing through the second signal line. At least one surface acoustic wave resonator is connected between the first signal line and the second signal line.

A surface acoustic wave filter device according to a second preferred embodiment of the present invention includes a piezoelectric substrate, first and second longitudinally coupled resonator type surface acoustic wave 5-IDT filter units that are cascade-connected and arranged on the piezoelectric substrate, and at least two surface acoustic wave resonators arranged on the piezoelectric substrate. Each of the first and second surface acoustic wave filter units includes a first IDT, second and third IDTs arranged on both sides of the first IDT in a surface acoustic wave propagation direction, fourth and fifth IDTs arranged in the surface acoustic wave propagation direction on both sides of an area in which the first through third IDTs are arranged, and first and second reflectors arranged in the surface acoustic wave propagation direction, each of the first IDTs of the first and second surface acoustic wave filter units including first and second sub-IDT portions defined by dividing the first respective IDTs in the surface acoustic wave propagation direction. The surface acoustic wave propagation directions of the first and second the surface acoustic wave filter units being parallel or substantially parallel with each other. Each of the first and second surface acoustic wave filter units further includes a first signal line electrically connecting the fourth IDTs of the first and second surface acoustic wave filter units, a second signal line electrically connecting the first segment IDTs of the first IDTs of the first and second surface acoustic wave filter units, a third signal line electrically connecting the second sub-IDT portions of the first IDTs of the first and second surface acoustic wave filter units, and a fourth signal line electrically connecting the fifth IDTs of the first and second surface acoustic wave filter units. A phase of an electrical signal flowing through the first signal line is different by about 180° from a phase of an electrical signal flowing through the second signal line, and a phase of an electrical signal flowing through the third signal line is different line by about 180° from a phase of an electrical signal flowing through the fourth signal. At least one of the at least two surface acoustic wave resonators is electrically connected between the first signal line and the second signal line, and between the third signal line and the fourth signal line.

According to the first and second preferred embodiments, the first surface acoustic wave filter unit is preferably connected to an unbalanced terminal, and the second surface acoustic wave filter unit is connected to first and second balanced terminals. The surface acoustic wave filter device having a balanced-unbalanced conversion function is thus provided.

The surface acoustic wave filter device according to preferred embodiments of the present invention is not limited to a surface acoustic wave filter device having a balanced-unbalanced conversion function. The surface acoustic wave filter device may be an unbalanced signal input unbalanced signal output filter in which the first surface acoustic wave filter unit is connected to a first unbalanced terminal and the second surface acoustic wave filter unit is connected to a second unbalanced terminal. The surface acoustic wave filter device may be a balanced signal input (output) balanced signal output (input) filter in which the first surface acoustic wave filter unit is connected to first and second balanced terminals and the second surface acoustic wave filter unit is connected to third and fourth balanced terminals.

In accordance with a preferred embodiment of the present invention, a duplexer is provided which includes a bandpass filter defined by the surface acoustic wave filter device according to a preferred embodiment of the present invention. The duplexer provides excellent sharpness of the filter characteristics and supports a wide band design implementation.

In accordance with the first preferred embodiment of the present invention, the first and second longitudinally coupled resonator type surface acoustic wave filter units are cascade-connected. Each of the first and second surface acoustic wave filter units includes the first to third IDTs. The IDTs are arranged so that the phase of the signal flowing through the first signal line electrically connecting the second IDTs is inverted from the phase of the signal flowing through the second signal line electrically connecting the third IDTs. Furthermore, the surface acoustic wave resonator is connected between the first and second signal lines. This arrangement increases the sharpness of the filter characteristics and increases the width of the passband. More specifically, the signals having substantially opposite phases flow through the first and second signal lines. With the surface acoustic wave resonator connected between the first and second signal lines, the signals flowing from the first and second signal lines to the surface acoustic wave resonator cancel each other out. In this manner, the sharpness of the filter characteristics is improved. In addition, since a ground line between stages is substantially reduced, a capacitance with respect to the ground is reduced, and the width of the passband is increased.

In the surface acoustic wave filter device of the second preferred embodiment of the present invention, the first and second longitudinally coupled resonator type surface acoustic wave filter units are cascade-connected with each unit including first through fifth IDTs. The IDTs are arranged so that the signals flowing through the first signal line and the second signal line are opposite in phase to each other and so that the signals flowing through the third and fourth signal lines are opposite in phase to each other. At least one surface acoustic wave resonator is electrically connected between the first signal line and the second signal line, and between the third signal line and the fourth signal line. As in the first preferred embodiment, the sharpness of the filter characteristics is improved and the width of the passband is increased.

Thus, preferred embodiments of the present invention provide a surface acoustic wave filter device that not only increases the sharpness of the filter characteristics but also expands passband width.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the drawings.

Figure 1:
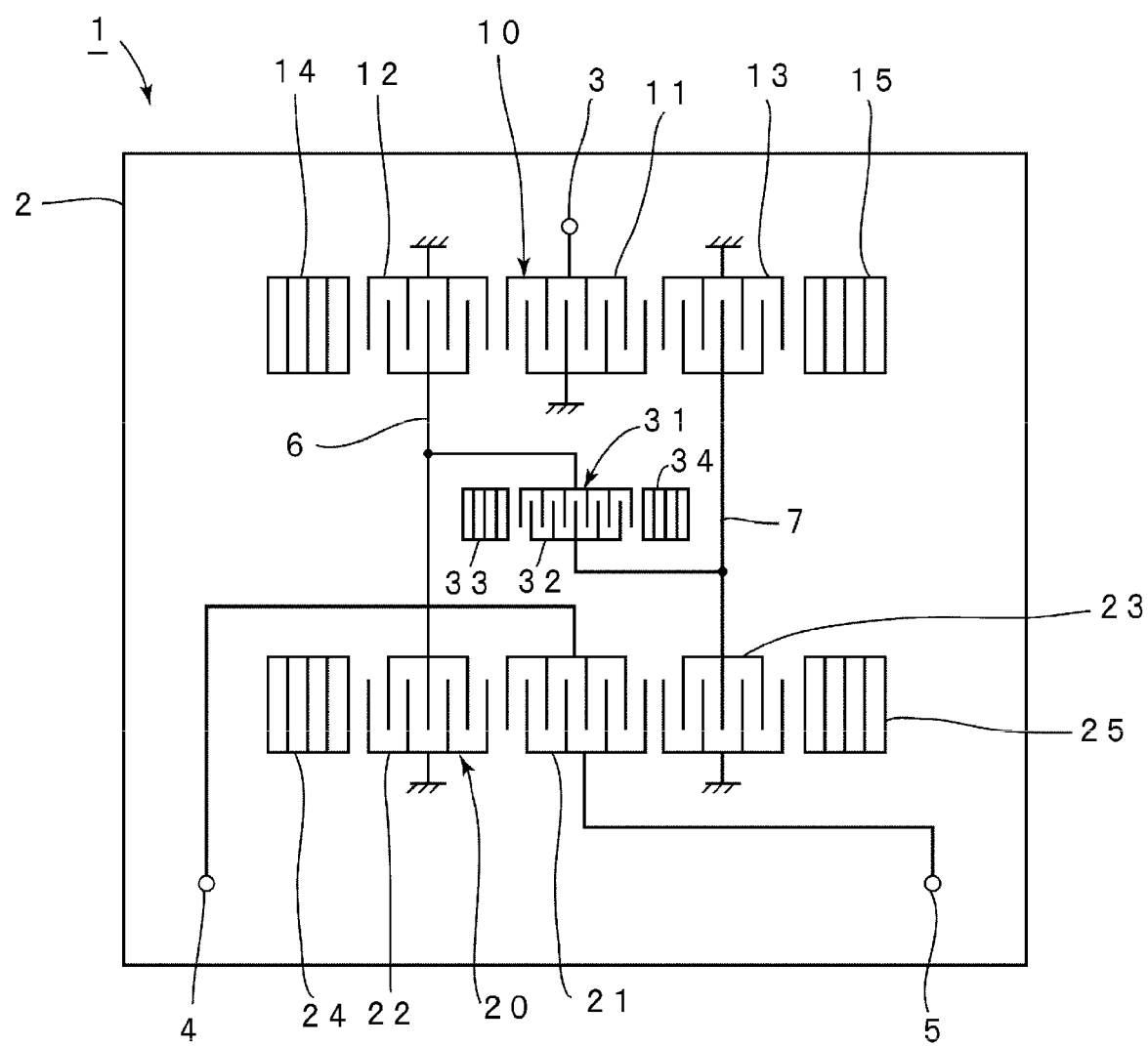
FIG. 1 is a schematic plan view illustrating a surface acoustic wave filter device according a first preferred embodiment of the present invention.

FIG. 1 is a schematic plan view of a surface acoustic wave filter device according to a first preferred embodiment of the present invention.

The surface acoustic wave filter device 1 of the present preferred embodiment is preferably used as an EGSM reception side bandpass filter having a balanced-unbalanced transform function. The transmission frequency band in the EGSM is 880 MHz to 915 MHz while the reception frequency band is 925 MHz to 960 MHz.

The surface acoustic wave filter device 1 includes the electrode structure illustrated in FIG. 1 on the piezoelectric substrate 2. The surface acoustic wave filter device 1 includes an unbalanced terminal 3, and first and second balanced terminals 4 and 5. In accordance with the present preferred embodiment, the impedance of the unbalanced terminal 3 is preferably about 50Ω, for example, and the impedance between the first and second balanced terminals 4 and 5 is preferably about 100Ω, for example. The piezoelectric substrate 2 is preferably made of but is not particularly limited to a 40°±5° Y cut X propagation $LiTaO_3$ substrate, for example.

The illustrated electrode structure is formed by patterning Al on the piezoelectric substrate 2. In other words, first and second longitudinally coupled resonator type acoustic wave filter units 10 and 20 and a surface acoustic wave resonator 31 are formed.

The first acoustic wave filter unit 10 includes a first IDT 11, and second and third IDTs 12 and 13 arranged on both sides of the first IDT 11 in a surface acoustic wave propagation direction. First and second reflectors 14 and 15 are arranged on both sides of an area in the surface acoustic wave propagation direction in which the first through third IDTs 11 to 13 are arranged.

Similarly, the second surface acoustic wave filter unit 20 includes a first IDT 21, and second and third IDTs 22 and 23 arranged on both sides of the first IDT 21 in the surface acoustic wave propagation direction. First and second reflectors 24 and 25 are arranged on both sides of an area in the surface acoustic wave propagation direction in which the first to third IDTs 21 to 23 are arranged.

The surface acoustic wave resonator 31 is preferably a one-port type surface acoustic wave resonator and includes an IDT 32 and reflectors 33 and 34 arranged on both sides of the IDT 32 in the surface acoustic wave propagation.

One end of the first IDT 11 in the first acoustic wave filter unit 10 is connected to the unbalanced terminal 3. The other end of the first IDT 11 is connected to the ground potential. One end of the second IDT 12 is connected to the ground potential while the other end thereof is connected to one end of the second IDT 22 in the second surface acoustic wave filter unit 20 via a first signal line 6.

One end of the third IDT 13 is connected to the ground potential while the other end thereof is connected to one end of the third IDT 23 in the second surface acoustic wave filter unit 20 via a second signal line 7. More specifically, the first signal line 6 connects the second IDTs 12 and 22, and the second signal line 7 connects the third IDTs 13 and 23.

The other end of each of the second and third IDTs 22 and 23 in the second surface acoustic wave filter unit 20 is connected to the ground potential.

One end of the first IDT 21 in the second surface acoustic wave filter unit 20 is connected to the first balanced terminal 4 while the other end thereof is connected to the second balanced terminal 5.

In accordance with the present preferred embodiment, in an area in which the first IDT 11 in the first acoustic wave filter unit 10 is adjacent to the second IDT 12, an electrode finger of the first IDT 11 is connected to the signal line, namely, to a hot voltage, and the outermost electrode finger of the second IDT 12 is connected to the ground potential. On the other hand, in an area in which the IDTs 11 and 13 are adjacent to each other, both of the outermost electrode finger of the first IDT 11 and the outermost electrode finger of the third IDT 13 are connected to the ground potential. The IDTs 12 and 13 are similarly configured. The phase of a signal flowing through the second signal line 7 is different by about 180° from the phase of a signal flowing through the first signal line 6.

The IDTs 22 and 23 are arranged so that the phases of the signals transmitted to the IDT 21 are different from each other by about 180°.

The number of electrode fingers of the IDT 21 is preferably an even number. The phases of the signals transmitted from the two ends of the IDT 21 to first and second balanced terminals are different from each other by about 180°.

With the first to third IDTs 11 to 13 arranged as described above in accordance with the present preferred embodiment, the phase of the signal flowing through the first signal line 6 and the phase of the signal flowing through the second signal line 7 are made different by about 180°. As long as the phases of the signals flowing through the first and second signal lines 6 and 7 are different from each other by about 180°, the first to third IDTs 11 to 13 may preferably have a different configuration.

In the present preferred embodiment, the surface acoustic wave resonator 31 is connected between the first and second signal lines 6 and 7 that are configured such that the signals flowing therethrough are opposite in phase. The anti-resonance point of the surface acoustic wave resonator 31 is set within a passband of the surface acoustic wave filter device 1 and the resonance point thereof is set within an attenuation region in the vicinity of the edge of a low frequency side of the passband. The location of the resonance point of the surface acoustic wave resonator 31, namely, the attenuation region in the vicinity of the edge of the low frequency side of the passband refers to an attenuation range that provides increased sharpness of the filter characteristics in the low frequency side of the passband of the filter as compared to a configuration in which the surface acoustic wave resonator 31 is not connected.

The surface acoustic wave filter device 1 of the present preferred embodiment, including the surface acoustic wave resonator 31 connected between the first and second signal lines 6 and 7, not only increases the sharpness of the filter characteristics in the passband low frequency side but also expands the passband. This is described with reference to specific experiments.

The first acoustic wave filter unit 10, the second surface acoustic wave filter unit 20, and the surface acoustic wave resonator 31 were produced in accordance with the following specifications.

In the description that follows, wavelength λI refers to a wave determined by a pitch of electrode fingers of each IDT.

Figure 2:
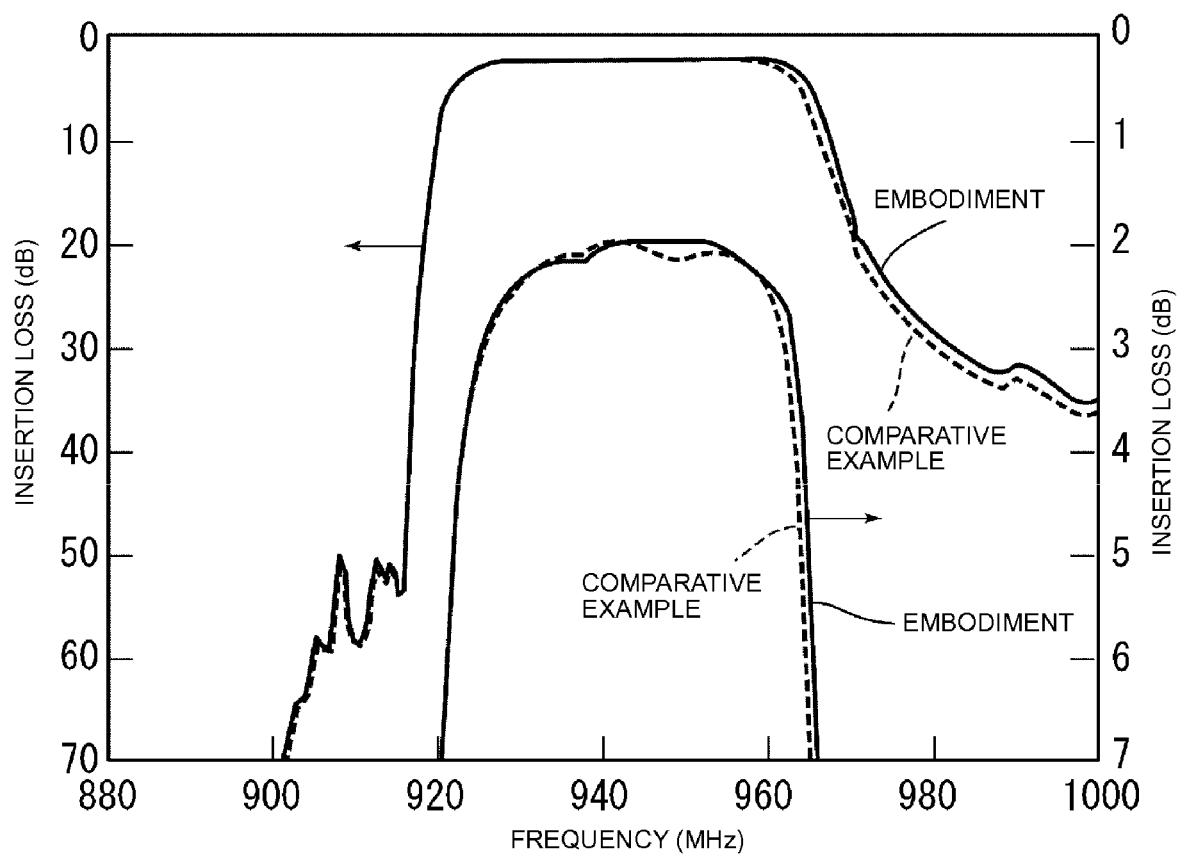
FIG. 2 illustrates the filter characteristics of surface acoustic wave filter devices of the first preferred embodiment and a comparative example.

First surface acoustic wave filter unit 10
Cross width: about 36.8 λI
Number of electrode fingers of the first IDT 11: 38
Number of electrode fingers of each of the first and second IDTs 12 and 13: 28
Number of electrode fingers of each of the first and second reflectors 14 and 15: 65
Metallization ratio: about 0.73
Electrode layer thickness: about 0.088 λI Second surface acoustic wave filter unit 20
Cross width: about 36.8 λI
Number of electrode fingers of the first IDT 21: 40
Number of electrode fingers of each of the first and second IDTs 22 and 23: 28
Number of electrode fingers of each of the first and second reflectors 24 and 25: 65
Metallization ratio: about 0.73
Electrode layer thickness: about 0.088 λI
Specifications of the surface acoustic wave resonator 31
Cross width: about 5.8 λI
Number of electrode fingers of the IDT 32: 61
Number of electrode fingers of each of the reflectors 33 and 34: 18
Metallization ratio: about 0.50
Electrode layer thickness: about 0.109 λI The filter characteristics of the surface acoustic wave filter device 1 of the present preferred embodiment were measured. FIG. 2 illustrates the measurement results represented by solid lines.

Figure 3:
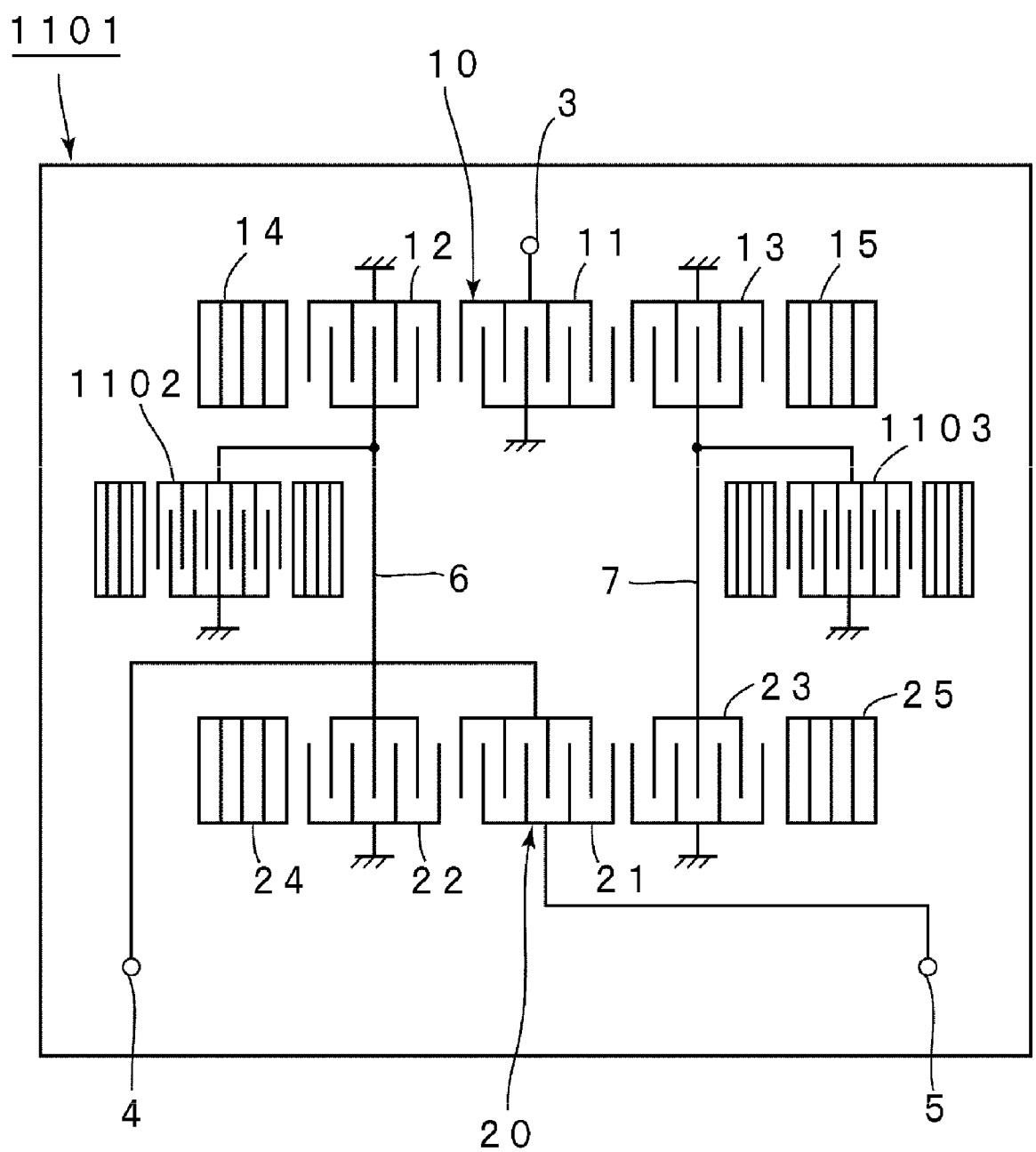
FIG. 3 is a schematic plan view of the surface acoustic wave filter device prepared as the comparative example.

A surface acoustic wave filter device 1101 illustrated in FIG. 3 was produced as a comparative example. The surface acoustic wave filter device 1101 is similar to the surface acoustic wave filter device 1 of the present preferred embodiment except that instead of the surface acoustic wave resonator 31, a surface acoustic wave resonator 1102 is connected between the first signal line 6 and the ground potential and a surface acoustic wave resonator 1103 is connected between the second signal line 7 and the ground potential. In this case, the electrode finger cross width in the surface acoustic wave resonators 1102 and 1103 is set to be approximately twice the cross width of the surface acoustic wave resonator 31 illustrated in FIG. 1 in order to be substantially equivalent to the first preferred embodiment. The rest of the design is substantially identical to the surface acoustic wave filter device according to the first preferred embodiment. The surface acoustic wave filter device 1101 was thus produced as a comparative example, and the filter characteristics thereof were measured. FIG. 2 illustrates the measurement results by broken lines.

As illustrated in FIG. 2, the surface acoustic wave filter device 1 provides a wider passband than the surface acoustic wave filter device 1101. More specifically, the bandwidth at about 3 dB attenuation, i.e., the width of the passband at an insertion loss of about 3 db of the surface acoustic wave filter device 1 below a through level is wider than the comparative example by about 1.5 MHz. The sharpness of the filter characteristics at the passband low frequency side of the surface acoustic wave filter device 1 of the present preferred embodiment remains at the same or substantially the same level as the comparative example.

In accordance with the present preferred embodiment, the connection of the surface acoustic wave resonator 31 not only increases the sharpness of the filter characteristics at the passband low frequency side but also increases the width of the passband. The likely reason for these results is described below.

As previously discussed, the surface acoustic wave resonator is connected in parallel with the surface acoustic wave filter to increase the sharpness in the passband low frequency side of the filter characteristics in the related art. In such a case, the resonance point of the surface acoustic wave resonator is set in the attenuation region in the vicinity of the passband low frequency side and the anti-resonance point is set in the passband. In this case, however, an electrode portion of the surface acoustic wave filter connected to the ground potential is complex and relatively wide as illustrated in FIG. 3, and for this reason, a capacitance of the surface acoustic wave filter becomes relatively large with respect to the ground. In particular, if the capacitance at an inter-stage portion with respect to ground is increased in the longitudinally coupled resonator type surface acoustic wave filter device 101 as illustrated in FIG. 3, the passband width is reduced. In contrast, in accordance with the present preferred embodiment, the phase of an electrical signal flowing through the first signal line 6 is different by about 180° from the phase of an electrical signal flowing through the second signal line 7. The surface acoustic wave resonator 31 is connected between the first and second signal lines 6 and 7. The signals transmitted to the surface acoustic wave resonator 31 from the first and second signal lines 6 and 7 cancel each other out.

Since the two signals cancel each other out most efficiently at the resonance point of the surface acoustic wave resonator 31, the sharpness of the low frequency side of the filter characteristics is increased in substantially the same manner as in the surface acoustic wave filter device 1101 in which the surface acoustic wave resonators 1102 and 1103 are connected in parallel. In addition, a ground line at the inter-stage portion is substantially reduced, and the passband width is increased accordingly.

Figure 4:
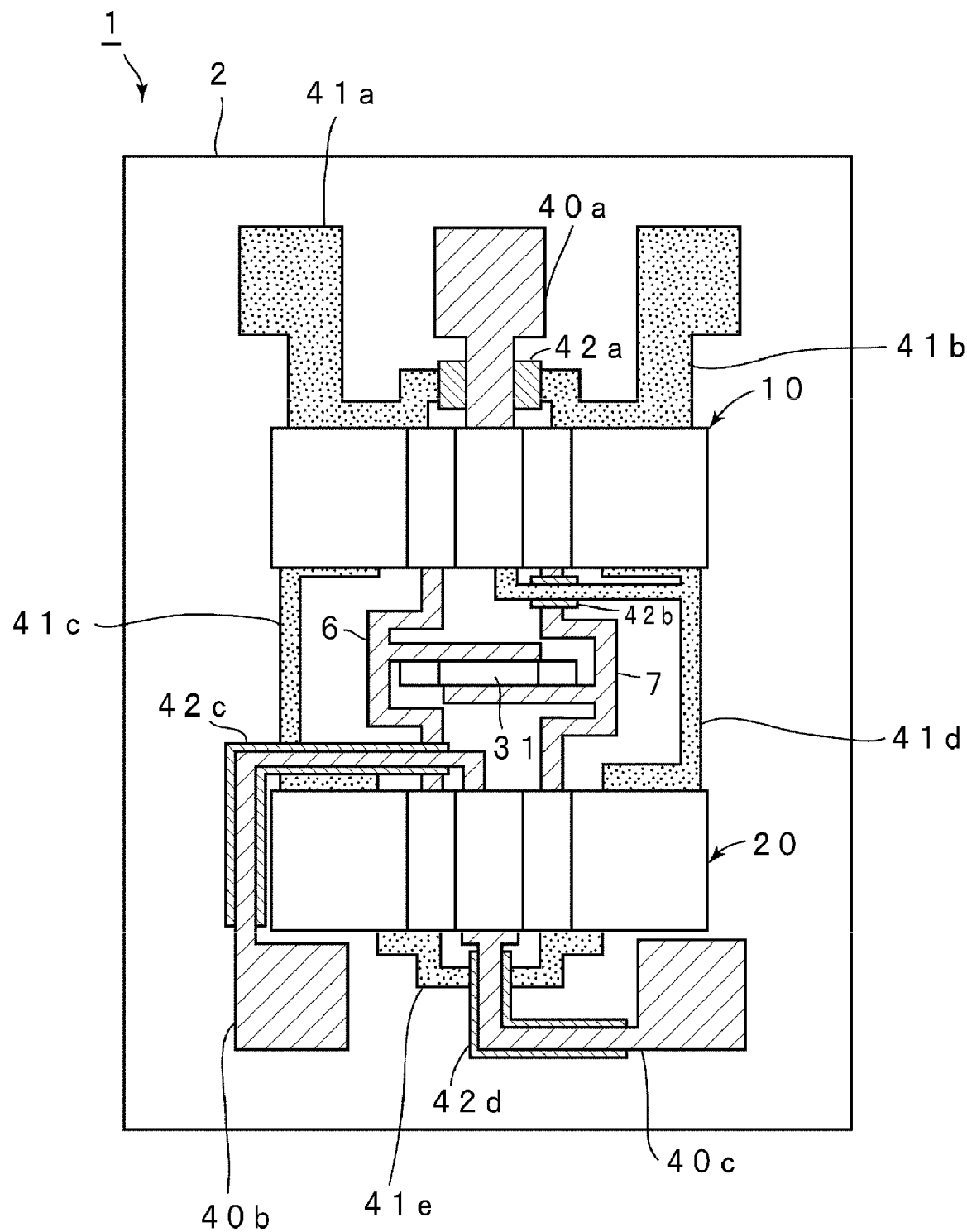
FIG. 4 is a schematic plan view of a layout of electrodes on a piezoelectric substrate in the surface acoustic wave filter device according to the first preferred embodiment of the present invention.

For reference purposes only, FIG. 4 schematically illustrates a layout of an electrode portion on the piezoelectric substrate 2 of the surface acoustic wave filter device 1 in accordance with the first preferred embodiment with the electrode portion cross-hatched. The first and second signal lines 6 and 7, electrodes 40a to 40c connected to signal potentials, and electrodes 41a to 41e connected to the ground potential are all denoted by cross-hatching. Insulator layers 42a to 42d prevent the electrodes connected to different voltages from being short-circuited.

Figure 5:
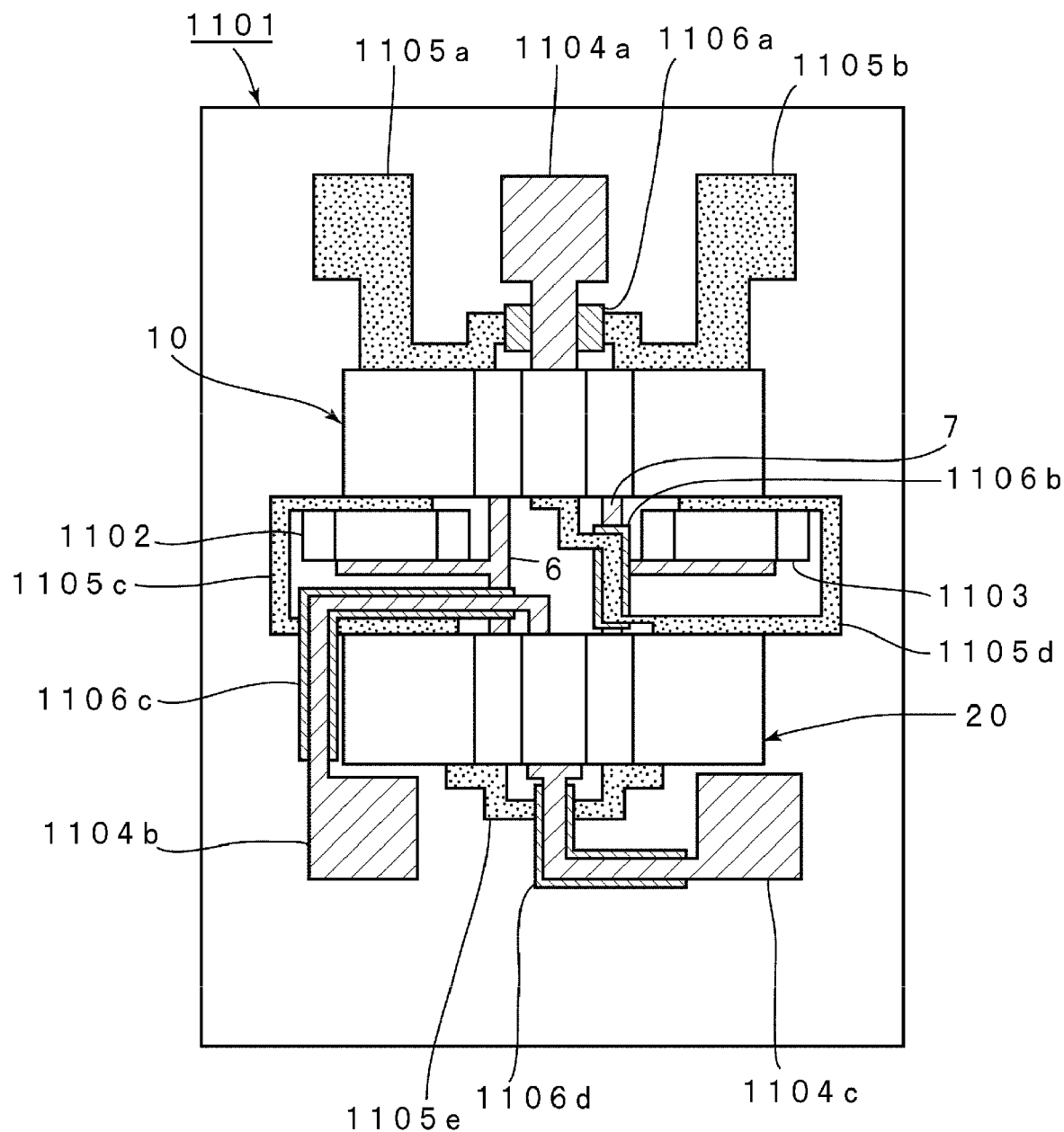
FIG. 5 is a schematic plan view of a layout of electrodes on a piezoelectric substrate in the surface acoustic wave filter device of the comparative example.

For comparison, FIG. 5 illustrates a layout of electrodes on the piezoelectric substrate in the surface acoustic wave filter device 1101 as the comparative example illustrated in FIG. 3. The first and second signal lines 6 and 7, and electrodes 1104a to 1104c and 1105a to 1105e connected to signal voltages and the ground potential are denoted by cross-hatching. Insulator layers 1106a to 1106d prevent the electrodes connected to different potentials from being short-circuited.

As is evident from the comparison of FIG. 4 and FIG. 5, the present preferred embodiment substantially reduces the electrode area connected to the ground potential in the inter-stage region as compared to the comparative example. A capacitance to ground is not significantly generated in the first and second signal lines 6 and 7 in the inter-stage region.

Figure 6:
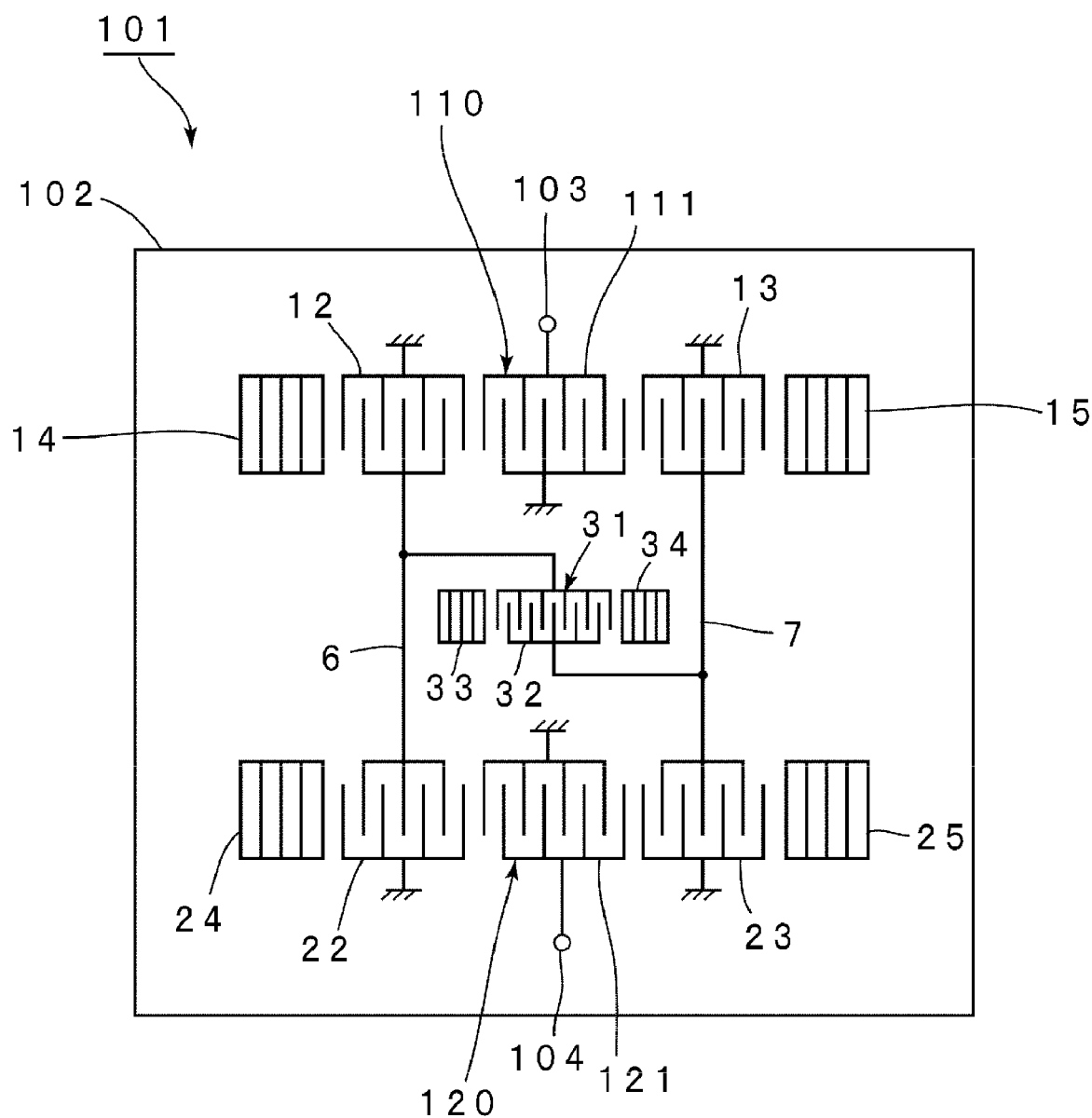
FIG. 6 is a schematic plan view of a surface acoustic wave filter device according to a second preferred embodiment of the present invention.

In accordance with the first preferred embodiment, the surface acoustic wave filter device 1 has a balanced-unbalanced conversion function. However, preferred embodiments of the present invention are not limited to the surface acoustic wave filter device having the balanced-unbalanced conversion function. More specifically, an electrode structure provided on a piezoelectric substrate 102 in the surface acoustic wave filter device 101 according to a second preferred embodiment of the present invention is illustrated in FIG. 6. First and second surface acoustic wave filter units 110 and 120 are cascade-connected between an unbalanced input terminal 103 and an unbalanced output terminal 104. In other words, one end of a first IDT 111 in the first surface acoustic wave filter unit 110 is connected to the unbalanced input terminal 103, and the other end thereof is connected to the ground potential. In addition, one end of a first IDT 121 in the second surface acoustic wave filter unit 120 is connected to the ground potential and the other end thereof is connected to the unbalanced output terminal 104. The rest of the structure of the surface acoustic wave filter device 101 is substantially the same as that of the surface acoustic wave filter device 1 of the first preferred embodiment. The same reference numerals are used for the same structural elements, and the discussion thereof is omitted herein.

In this manner, the surface acoustic wave filter device may be a surface acoustic wave filter device having an unbalanced signal input and an unbalanced signal output.

Since the surface acoustic wave resonator 31 is connected between the first and second signal lines 6 and 7 in the second preferred embodiment, the phases of the signals flowing through the first and second signal lines 6 and 7 are different from each other by about 180°. Furthermore, the resonance point of the surface acoustic wave resonator 31 is set within the attenuation region in the vicinity of the edge of the passband low frequency side and the anti-resonance point thereof is set within the passband. For this reason, as in the first preferred embodiment, the sharpness of the filter characteristics in the passband low frequency side is increased, and the width of the passband is increased.

Figure 7:
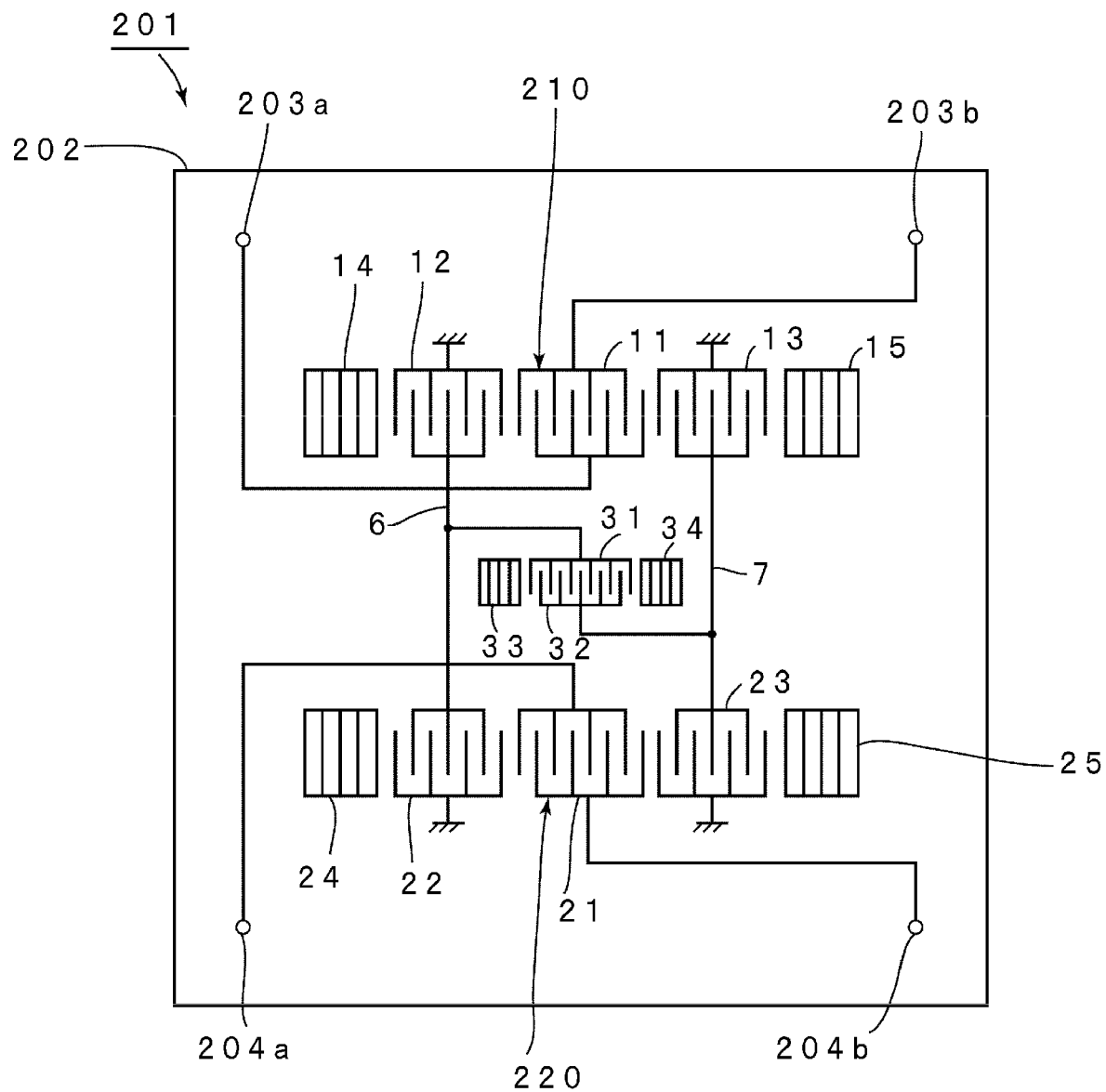
FIG. 7 is a schematic plan view of a surface acoustic wave filter device according to a third preferred embodiment of the present invention.

A surface acoustic wave filter device 201 according to a third preferred embodiment of the present invention is shown in FIG. 7 and includes an electrode structure provided on a piezoelectric substrate 202. More specifically, first and second surface acoustic wave filter units 210 and 220 are cascade-connected between first and second balanced signal input terminals 203a and 203b and first and second balanced signal output terminals 204a and 204b. As in the first preferred embodiment, the surface acoustic wave resonator 31 is connected in the inter-stage portion.

The surface acoustic wave filter units 210 and 220 are configured in substantially the same manner as the first and second acoustic wave filter units 10 and 20 in the first preferred embodiment. However, it is noted that one end of the first IDT 11 is connected to the first balanced signal input terminal 203a and that the other end of the first IDT 11 is connected to the second balanced signal input terminal 203b. In the second surface acoustic wave filter unit 220, one end of the central first IDT 21 is connected to the first balanced signal output terminal 204a and the other end thereof is connected to the second balanced signal output terminal 204b. The rest of the structure of the surface acoustic wave filter device 201 is substantially the same as that of the surface acoustic wave filter device 1 of the first preferred embodiment. Similar to the first preferred embodiment, the third preferred embodiment provides an increased sharpness of the filter characteristics in the passband low frequency side and an increased passband width.

Figure 8:
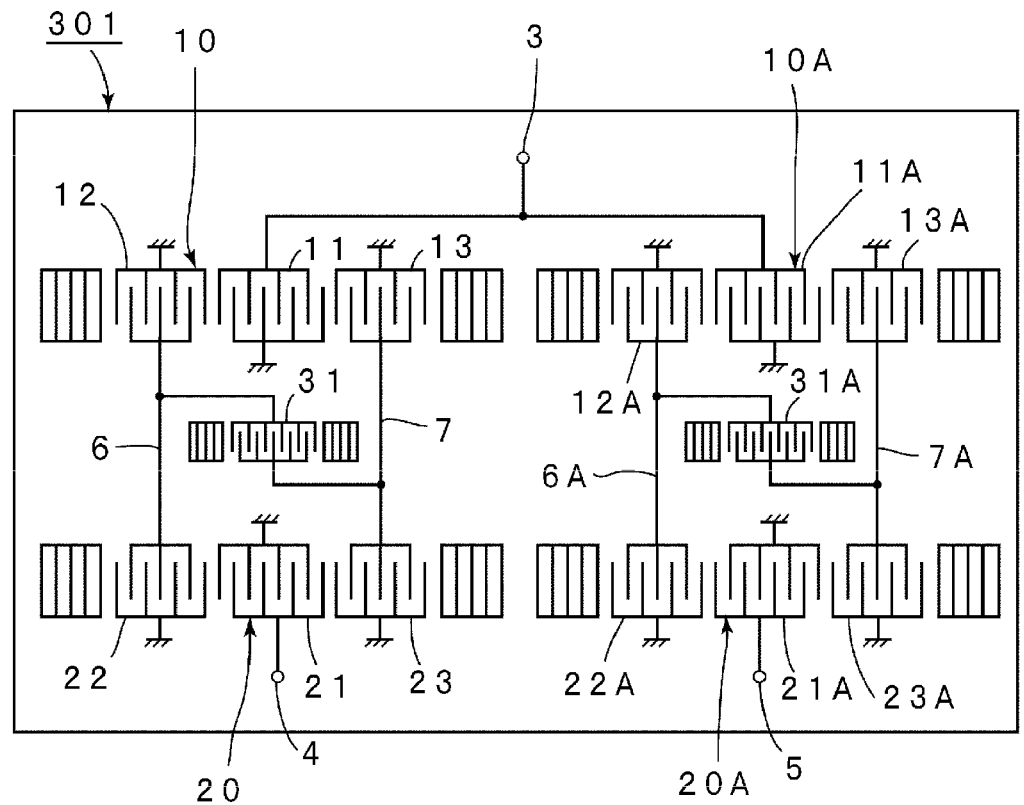
FIG. 8 is a schematic plan view of a surface acoustic wave filter device according to a fourth preferred embodiment of the present invention.

FIG. 8 is a schematic plan view showing an electrode structure of a surface acoustic wave filter device in accordance with a fourth preferred embodiment of the present invention. The surface acoustic wave filter device 301 of the fourth preferred embodiment includes two first 3-IDT longitudinally coupled resonator type surface acoustic wave filter units 10 and 10A connected to the unbalanced terminal 3. The second longitudinally coupled resonator type surface acoustic wave filter unit 20 is connected as a subsequent stage to the first acoustic wave filter unit 10. The surface acoustic wave resonator 31 is connected between the first and second signal lines 6 and 7. One end of the first IDT 21 in the second surface acoustic wave filter unit 20 is electrically connected to the ground potential and the other end thereof is electrically connected to the first balanced terminal 4.

The second 3-IDT longitudinally coupled resonator type surface acoustic wave filter unit 20A is connected as a subsequent stage to the first acoustic wave filter unit 10A. A surface acoustic wave resonator 31A is connected between first and second signal lines 6A and 7A. One end of the first IDT 21A in the second surface acoustic wave filter unit 20A is connected to the ground potential and the other end thereof is connected to the second balanced terminal 5.

In accordance with the fourth preferred embodiment, the IDTs 11 to 13, 11A to 13A, and 21 to 23, and 21A to 23A are arranged such that the phases of the signals flowing through the first and second signal lines 6 and 7 are different from each other by about 180°, such that the phases of the signals flowing through the first and second signal lines 6A and 7A are different from each other by about 180°, and such that the phases of the signals picked up from the first and second balanced terminals 4 and 5 are different from each other by about 180°. Furthermore, the surface acoustic wave resonator 31a has a resonance point within the attenuation region in the vicinity of the edge of the low frequency side of the passband of the filter and the anti-resonance point thereof within the passband. In accordance with the fourth preferred embodiment, the sharpness of the filter characteristics in the passband low frequency side is increased and the width of the passband is increased.

Preferred embodiments of the present invention are not limited to the surface acoustic wave filter device having a float balanced type balanced-unbalanced conversion function as illustrated in FIG. 1. The present invention may be applicable to a surface acoustic wave filter device such as the surface acoustic wave filter device 301 according to the fourth preferred embodiment having a neutral point type balanced-unbalanced conversion function.

Figure 9:
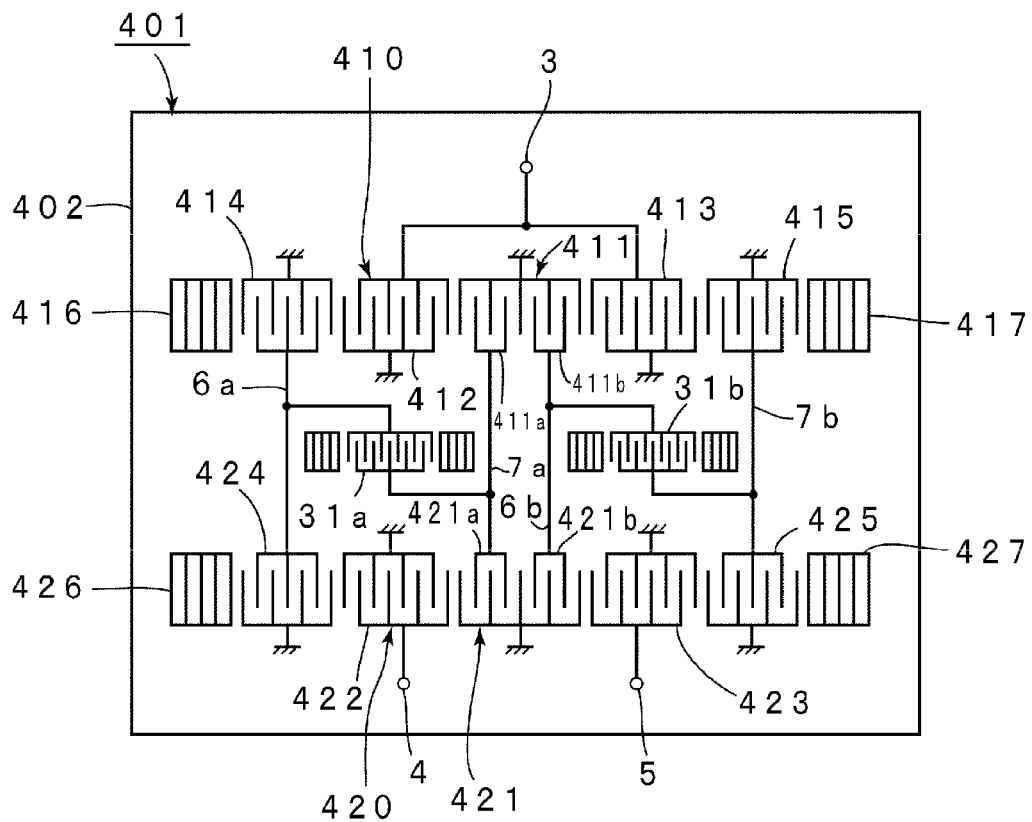
FIG. 9 is a schematic plan view of a surface acoustic wave filter device according to a fifth preferred embodiment of the present invention.
Figure 10:
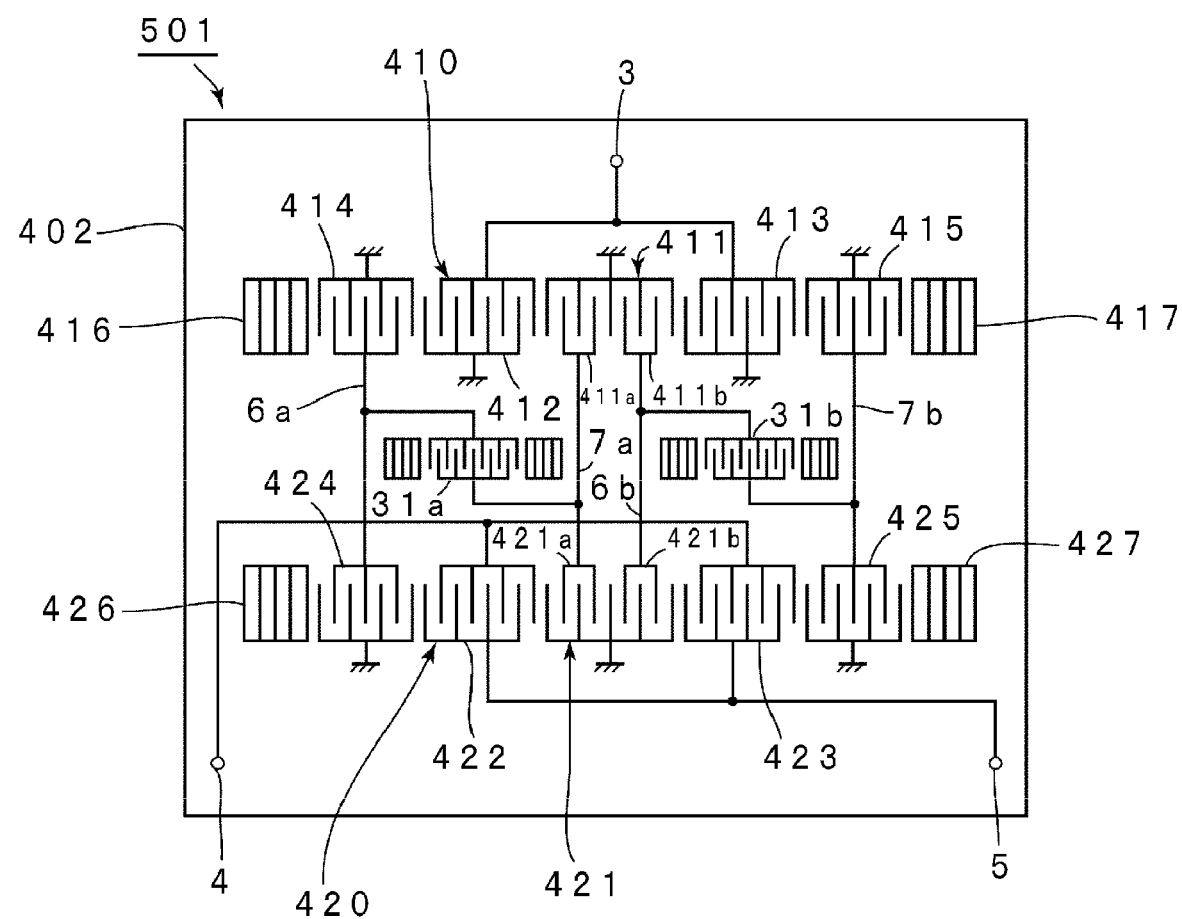
FIG. 10 is a schematic plan view of a surface acoustic wave filter device according to a sixth preferred embodiment of the present invention.

In addition, with reference to FIG. 9 and FIG. 10, preferred embodiments of the present invention are also applicable to a surface acoustic wave filter device including a longitudinally coupled resonator type 5-IDT surface acoustic wave filter.

A surface acoustic wave filter device 401 according to a fifth preferred embodiment is illustrated in FIG. 9 and includes an electrode structure provided on a piezoelectric substrate 402. First and second longitudinally coupled resonator type surface acoustic wave 5-IDT filter units 410 and 420 are cascade-connected between an unbalanced terminal 3 and first and second balanced terminals 4 and 5.

The first surface acoustic wave filter unit 410 includes a first IDT 411, second and third IDTs 412 and 413 arranged on both sides in the surface acoustic wave propagation direction of the first IDT 411, and a fourth IDT 414 and a fifth IDT 415 arranged on both sides in the surface acoustic wave propagation direction of an area in which the first to third IDTs 411 to 413 are arranged. First and second reflectors 416 and 417 are arranged respectively on both sides in the surface acoustic wave propagation direction of the fourth and fifth IDTs 414 and 415.

The second surface acoustic wave filter unit 420 includes first to fifth IDTs 421 to 425 and first and second reflectors 426 and 427.

The central first IDTs 411 and 421 include first and second sub-IDT portions 411a and 411b and 421a and 421b that are defined by dividing the first IDTs 411 and 421 in the surface acoustic wave propagation direction.

One end of each of the second and third IDTs 412 and 413 is connected to the unbalanced terminal 3 and the other ends of the second and third IDTs 412 and 413 are connected to the ground potential. One end of the fourth IDT 414 is connected to one end of the fourth IDT 424 in the second surface acoustic wave filter unit 420 via the first signal line 6a. The other ends of the IDTs 414 and 424 are respectively connected to the ground potential. One end of the first sub-IDT portion 411a is connected to the first sub-IDT portion 421a via the second signal line 7a.

The second sub-IDT portion 411b is electrically connected to the second sub-IDT portion 421b via a third signal line 6b. The ends of the IDTs 411 and 421 opposite to the sub-IDT portions thereof are connected the ground potential. One end of the fifth IDT 415 is connected to one end of the fifth IDT 425 via a fourth signal line 7b. The other ends of the fifth IDTs 415 and 425 are respectively connected to the ground potential.

One end of the second IDT 422 is connected to the ground potential and the other end thereof is connected to the first balanced terminal 4. Similarly, one end of the third IDT 423 is connected to the ground potential, and the other end thereof is connected to the second balanced terminal 5. The IDTs 411 to 415 and IDTs 421 to 425 are arranged such that the phase of the signal flowing through the first signal line 6a and the phase of the signal flowing through the second signal line 7a are different from each other by about 180°, the phase of the signal flowing through the third signal line 6b and the phase of the signal flowing through the fourth signal line 7b are different from each other by out 180°, and the phases of the signals picked up from the first and second balanced terminals 4 and 5 are different from each other by about 180°.

Furthermore, the surface acoustic wave resonator 31a is connected between the first and second signal lines 6 and 7, and the surface acoustic wave resonator 31b is connected between the first and second signal lines 6b and 7b.

In accordance with the present preferred embodiment, the resonance points of the surface acoustic wave resonators 31a and 31b are set within the attenuation region in the vicinity of the edge of the low frequency side of the passband, and the anti-resonance points thereof are set within the passband. In accordance with the present preferred embodiment, the sharpness of the filter characteristics is increased in the passband low frequency side and the width of the passband is increased.

The surface acoustic wave filter device 501 illustrated in FIG. 10 is substantially identical to the surface acoustic wave filter device 401, except that the connections of the unbalanced terminal 3 and the first and second balanced terminals 4 and 5 are different. More specifically, the surface acoustic wave filter device 501 according to a fifth preferred embodiment of the present invention is substantially identical to the surface acoustic wave filter device 401 except that the first balanced terminal 4 is electrically connected to one end of each of the second and third IDTs 422 and 423, and that the second balanced terminal 5 is electrically connected to the other ends of the second and third IDTs 422 and 423. In this manner, in the surface acoustic wave filter device including the longitudinally coupled resonator type resonator type surface acoustic wave 5-IDT filter, the connection type of the first and second balanced terminals for performing the balanced-unbalanced conversion function may preferably be a float balanced type, for example.

Figure 11:
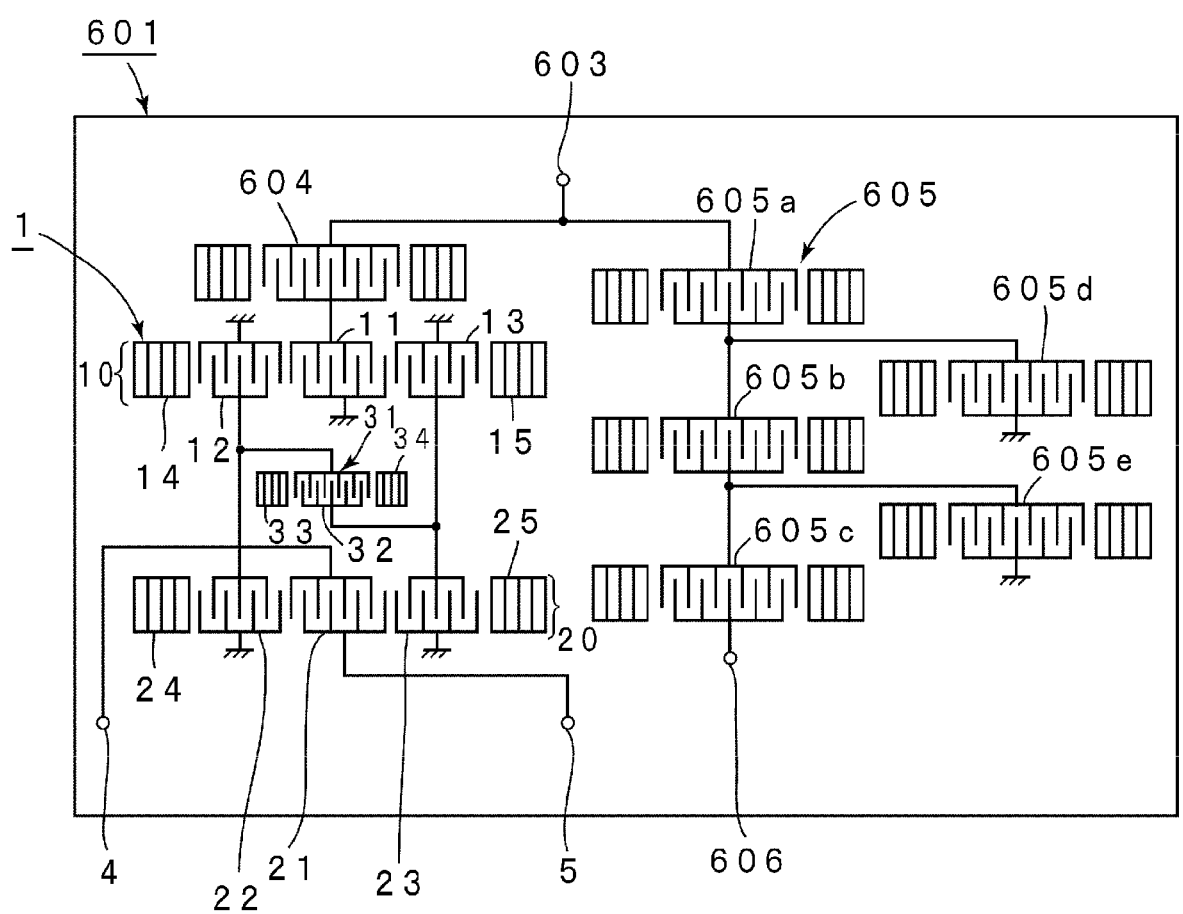
FIG. 11 is a schematic plan view of a surface acoustic wave filter device according to a seventh preferred embodiment of the present invention.
Figure 12:
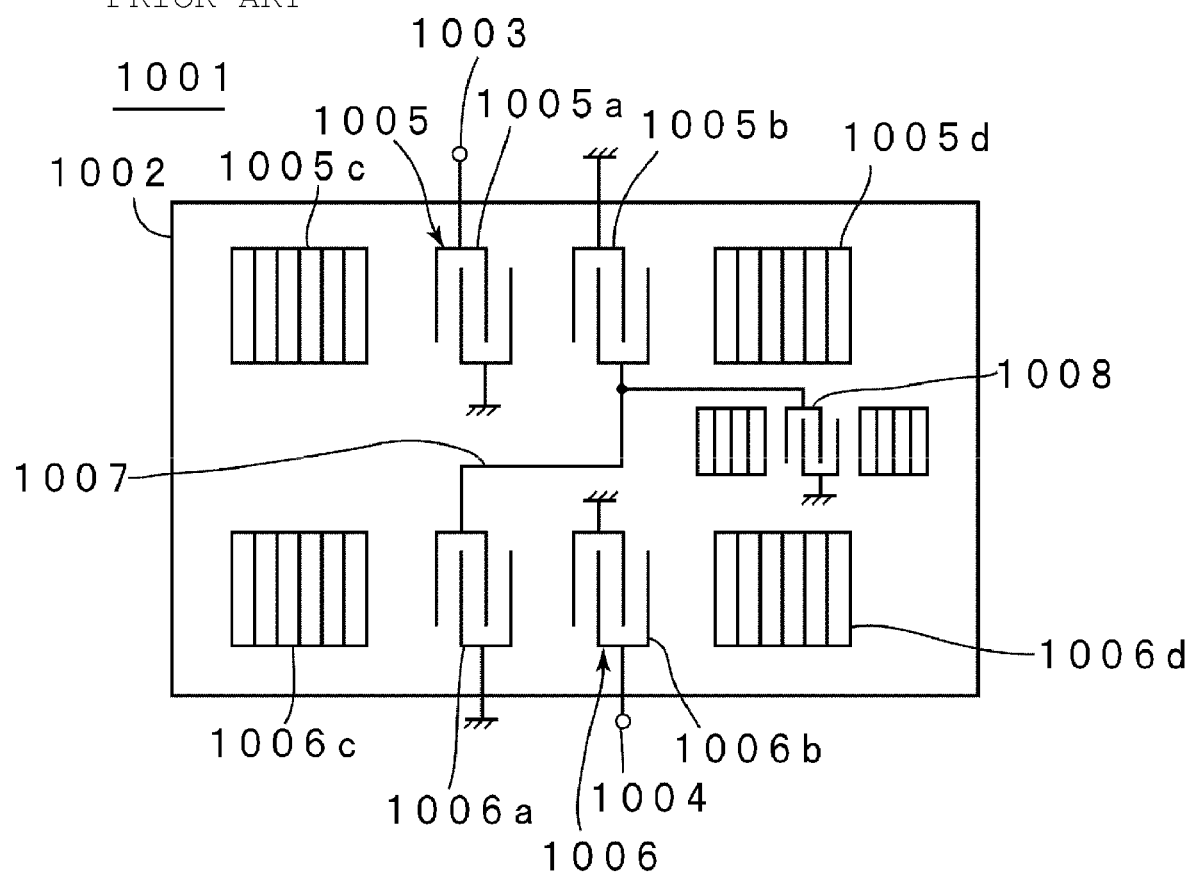
FIG. 12 is a schematic plan view of a surface acoustic wave filter device in the related art.

The surface acoustic wave filter device according to preferred embodiments of the present invention is preferably used as a bandpass filter for an RF stage in a cellular phone, for example. In particular, the surface acoustic wave filter device is preferably used for a duplexer 601 according to a preferred embodiment of the present invention as illustrated in FIG. 11. In the duplexer 601, the surface acoustic wave filter device 1 of the first preferred embodiment is connected via a surface acoustic wave resonator 604 to an unbalanced terminal 603 connected to an antenna. With this arrangement, a reception side bandpass filter including the first and second balanced terminals 4 and 5 defining receiving terminals is provided. On the other hand, a transmission side bandpass filter 605 is connected to the unbalanced terminal 603 connected to the antenna. In accordance with the present preferred embodiment, the transmission side bandpass filter 605 has a ladder type circuit arrangement that includes a plurality of serial arm resonators 605a to 605c, and a plurality of parallel arm resonators 605d and 605e. The plurality of serial arm resonators 605a to 605c are connected between a transmission side terminal 606 and the unbalanced terminal 603.

In accordance with the first preferred embodiment, the piezoelectric substrate is preferably a 40°±5° Y cut X propagation $LiTaO_3$ substrate, for example. The piezoelectric substrate may preferably be another piezoelectric substrate having a different cut angle, such as 64° to 72° Y cut X propagation $LiNbO_3$ substrate, a 41° Y cut X propagation LiNbO₃ substrate, for example, or may preferably be a different piezoelectric substrate made of a different piezoelectric material, for example.

In each of the surface acoustic wave resonators 31, 31A, 31a, and 31b in the above-described preferred embodiments, the resonance point thereof is set within the attenuation region in the vicinity of the edge of the passband low frequency side, and the anti-resonance point thereof is set within the passband. The sharpness of the filter characteristics on the passband low frequency side is increased. However, preferred embodiments of the present invention are not limited to this arrangement. The resonance point may be set within the passband and the anti-resonance point may be set within the attenuation region in the vicinity of the passband high frequency side so that an amount of attenuation is increased within the attenuation region in the vicinity of the edge of the passband high frequency side.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave filter device comprising:
   a piezoelectric substrate;
   first and second longitudinally coupled resonator type surface acoustic wave 5-IDT filter units that are cascade-connected to one another and arranged on the piezoelectric substrate; and
   at least two surface acoustic wave resonators arranged on the piezoelectric substrate; wherein
   each of the first and second surface acoustic wave filter units includes a first IDT, second and third IDTs arranged on both sides of the first IDT in a surface acoustic wave propagation direction, fourth and fifth IDTs arranged in the surface acoustic wave propagation direction on both sides of an area in which the first through third IDTs are arranged, and first and second reflectors arranged in the surface acoustic wave propagation direction;
   each of the first IDTs of the first and second surface acoustic wave filter units includes first and second sub-IDTs that are defined by dividing the first respective IDTs in the surface acoustic wave propagation direction;
   the surface acoustic wave propagation directions of the first and second the surface acoustic wave filter units being parallel or substantially parallel with each other;
   a first signal line electrically connects the fourth IDTs of the first and second surface acoustic wave filter units;
   a second signal line electrically connects the first sub-IDT of the first IDTs of the first and second surface acoustic wave filter units;
   a third signal line electrically connects the second sub-IDT of the first IDTs of the first and second surface acoustic wave filter units;
   a fourth signal line electrically connects the fifth IDTs of the first and second surface acoustic wave filter units;
   a phase of an electrical signal flowing through the first signal line is different by about 180° from a phase of an electrical signal flowing through the second signal line, and a phase of an electrical signal flowing through the third signal line is different by about 180° from a phase of an electrical signal flowing through the fourth signal line; and
   at least one of the at least two surface acoustic wave resonators is electrically connected between the first signal line and the second signal line, and at least one other of the at least two surface acoustic wave resonators is electrically connected between the third signal line and the fourth signal line.

2. The surface acoustic wave filter device according to claim 1, wherein the surface acoustic wave filter device has a balanced-unbalanced conversion function with the first surface acoustic wave filter unit being connected to an unbalanced terminal, and the second surface acoustic wave filter unit being connected to first and second balanced terminals.

3. The surface acoustic wave filter device according to claim 1, wherein the surface acoustic wave filter device is an unbalanced signal input unbalanced signal output filter with the first surface acoustic wave filter unit being connected to a first unbalanced terminal and the second surface acoustic wave filter unit being connected to a second unbalanced terminal.

4. The surface acoustic wave filter device according to claim 1, wherein the surface acoustic wave filter device is a balanced signal input balanced signal output filter with the first surface acoustic wave filter unit being connected to first and second balanced terminals and the second surface acoustic wave filter unit being connected to third and fourth balanced terminals.

5. A duplexer comprising as a bandpass filter the surface acoustic wave filter device according to claim 1.

* * * * *